United States Patent
Koval (10) Patent No.: US 9,443,864 B2
(45) Date of Patent: *Sep. 13, 2016

(54) SELF-ALIGNED FLOATING GATE IN A VERTICAL MEMORY STRUCTURE

(71) Applicant: Intel Corporation, Santa Clara, CA (US)

(72) Inventor: Randy J. Koval, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/835,922

(22) Filed: Aug. 26, 2015

(65) Prior Publication Data

US 2015/0364486 A1 Dec. 17, 2015

Related U.S. Application Data

(63) Continuation of application No. 14/512,832, filed on Oct. 13, 2014, now Pat. No. 9,196,625, which is a continuation of application No. 13/711,974, filed on Dec. 12, 2012, now Pat. No. 8,878,279.

(51) Int. Cl.

| H01L 29/788 | (2006.01) |
|---|---|
| H01L 27/115 | (2006.01) |
| G11C 16/04 | (2006.01) |
| H01L 29/78 | (2006.01) |
| H01L 21/02 | (2006.01) |
| H01L 21/28 | (2006.01) |
| H01L 21/311 | (2006.01) |
| H01L 21/3213 | (2006.01) |
| H01L 29/04 | (2006.01) |
| H01L 29/10 | (2006.01) |
| H01L 29/16 | (2006.01) |
| H01L 29/49 | (2006.01) |

(52) U.S. Cl.
CPC ..... *H01L 27/11556* (2013.01); *G11C 16/0408* (2013.01); *H01L 21/0217* (2013.01); *H01L 21/02148* (2013.01); *H01L 21/02164* (2013.01); *H01L 21/02178* (2013.01); *H01L 21/02181* (2013.01); *H01L 21/28273* (2013.01); *H01L 21/31111* (2013.01); *H01L 21/32133* (2013.01); *H01L 27/11519* (2013.01); *H01L 27/11521* (2013.01); *H01L 29/04* (2013.01); *H01L 29/1033* (2013.01); *H01L 29/16* (2013.01); *H01L 29/4916* (2013.01); *H01L 29/7827* (2013.01); *H01L 29/7883* (2013.01); *H01L 29/7889* (2013.01); *G11C 2213/71* (2013.01)

(58) Field of Classification Search
CPC ............... H01L 27/11519; H01L 27/11521; H01L 27/11556; H01L 29/04; H01L 29/1033; H01L 29/4916; H01L 29/7827; H01L 29/7883; H01L 29/7889
USPC .......................... 257/66, 239, 321, 315, 314
See application file for complete search history.

(56) References Cited

U.S. PATENT DOCUMENTS

| 7,042,044 B2 | 5/2006 | Wu |
|---|---|---|
| 7,250,651 B2 | 7/2007 | Kusters et al. |
| 8,878,279 B2 | 11/2014 | Koval |
| 2009/0029511 A1 | 1/2009 | Wu |
| 2011/0065270 A1 | 3/2011 | Shim et al. |
| 2013/0307050 A1 | 11/2013 | Ahn et al. |
| 2015/0187785 A1 | 7/2015 | Koval |

*Primary Examiner* — Long K Tran
(74) *Attorney, Agent, or Firm* — Alpine Technology Law Group LLC (57) ABSTRACT

A memory device or electronic system may include a memory cell body extending from a substrate, a self-aligned floating gate separated from the memory cell body by a tunneling dielectric film, and a control gate separated from the self-aligned floating gate by a blocking dielectric film. The floating gate is flanked by the memory cell body and the control gate to form a memory cell, and the self-aligned floating gate is at least as thick as the control gate. Methods for building such a memory device are also disclosed.

16 Claims, 7 Drawing Sheets

SELF-ALIGNED FLOATING GATE IN A VERTICAL MEMORY STRUCTURE

CROSS-REFERENCE TO RELATED APPLICATION

This application is a continuation of U.S. patent application Ser. No. 14/512,832, filed Oct. 13, 2014, which in turn is a continuation of U.S. patent application Ser. No. 13/711,974, filed Dec. 12, 2012, now U.S. Pat. No. 8,872,279, the disclosures of which is incorporated herein by reference in their entirety.

BACKGROUND

1. Technical Field

The present subject matter relates to semiconductor memories, and more specifically, to three-dimensional floating-gate flash memory.

2. Discussion

Many types of semiconductor memory are known. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The threshold voltage of the MOSFET-based flash cell can be changed by changing the amount of charge stored in the charge storage region of the cell, and the threshold voltage can be used to indicate a value that is stored in the flash cell.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string.

Some NAND flash devices may create stacks of flash memory cells in a three-dimensional array NAND strings. A stack of flash cells may include any number of flash cells with the source, channel, and drain arranged vertically so that as the cells are positioned, one on top of the other, they form a vertical NAND string. The individual memory cells of the vertical NAND string may be on different layers arranged around a body that extends outward from the substrate, with the charge storage region located on the same plane as the control gate, extending outward horizontally from the body.

BRIEF DESCRIPTION OF THE DRAWINGS

The accompanying drawings, which are incorporated in and constitute part of the specification, illustrate various embodiments. Together with the general description, the drawings serve to explain various principles. In the drawings:

FIG. 5A-L show cross-sectional side views of various stages of the method shown in FIG. 4.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
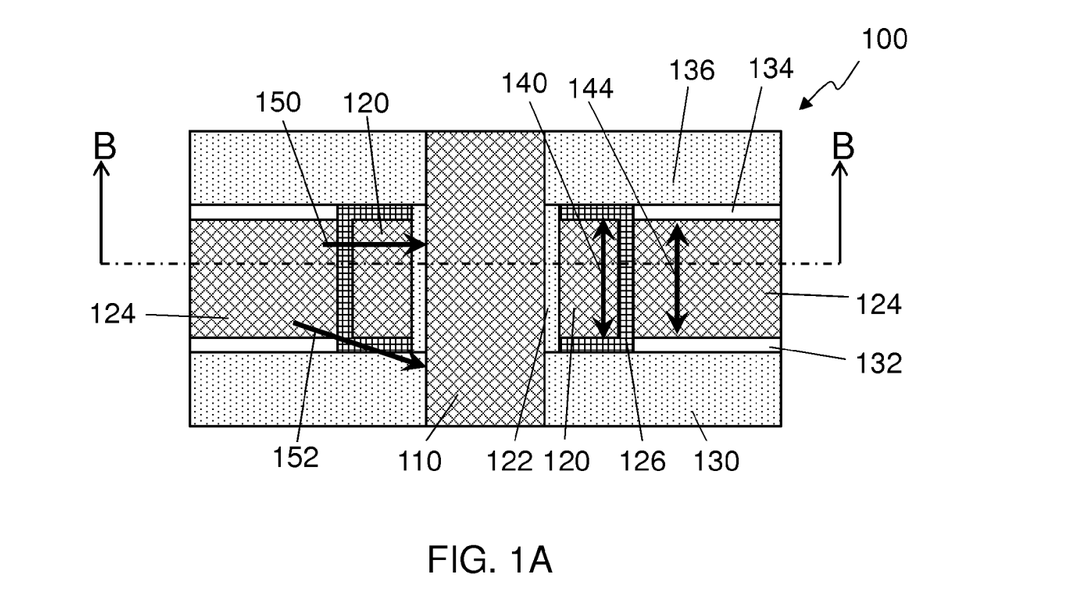
FIGS. 1A and 1B respectively show side and top cross-sectional views of an embodiment of a memory cell with a self-aligned floating gate.
Figure 1B:
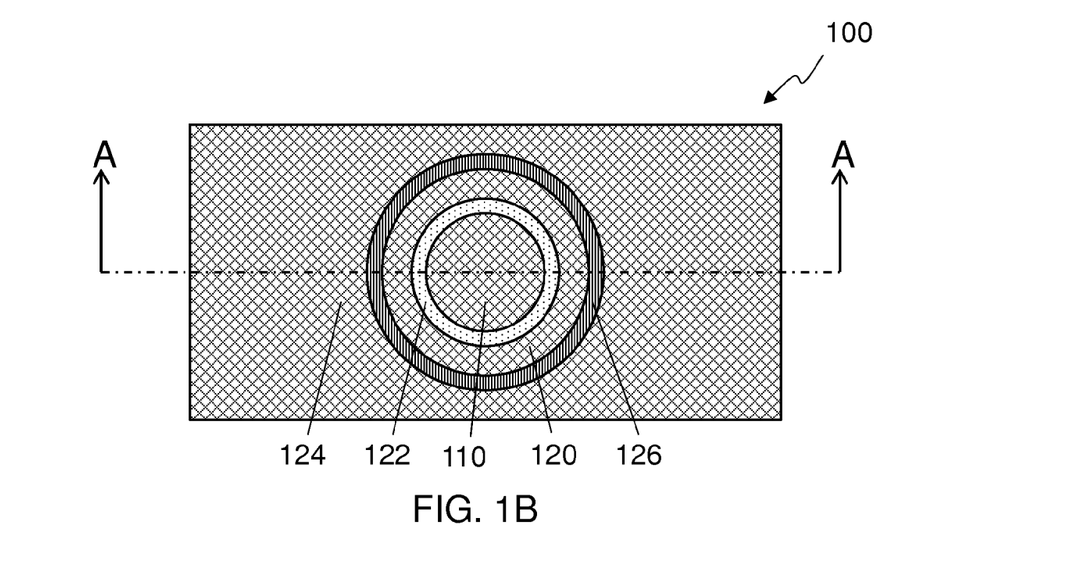

FIGS. 1A and 1B respectively show side and top cross-sectional views of an embodiment of a memory cell 100 with a self-aligned floating gate. Cross-section line B:B is shown in FIG. 1A to show the location of the cross-sectional view of FIG. 1B, and cross-section line A:A is shown in FIG. 1B to show the location of the cross-sectional view of FIG. 1A. The memory cell 100 shown in FIGS. 1A and 1B may be a part of a larger vertical memory structure extending out from a substrate. The memory cell 100 may be formed around a memory cell body 110 that may be made from a semiconductor material, which may be a polysilicon material in some embodiments, although other embodiments may use other materials such as doped crystalline silicon, gallium arsenide, germanium, or other semiconductors. The memory cell body 110 may extend out from the substrate. The substrate may include a base wafer or other structure upon which various materials be deposited, grown, or otherwise put in place in various patterns, layers, and thicknesses with a variety of processes to create the circuitry for the memory. The substrate may include some number of layers of other materials on the wafer below the memory cell body 110. The memory cell body 110 may have a pillar-like shape with a substantially circular cross-section in some embodiments, and the memory cell body 110 may be shared between several memory cells, with an individual memory cell 100 using a portion of the pillar for its channel.

In accordance with one or more embodiments, the substrate may be thought of as being a horizontal surface with the memory cell body extending up from the substrate in a generally vertical direction. The various layers described herein may have a generally horizontal orientation with a thickness measured in a vertical direction. A film may have any orientation and may conform to a surface having any geometry. A film may have a thickness that is measured in a perpendicular direction from the local surface that the film is deposited on. The word surround and its conjugations in this disclosure and claims may be interpreted as surrounding on a horizontal plane. In other words, a first feature may be said to surround a second feature if the first feature completely surrounds the second feature in at least one horizontal (or top view) cross-section, even if there are other cross-sectional views, horizontal or some other orientation, where the first feature may not fully surround the second feature.

The memory cell 100 may be interposed between a first tier insulating layer 130 and a second tier insulating layer 136. The tier insulating layers 130, 136 may be made from any non-conductive material, but may be made from silicon oxide in at least one embodiment. Some embodiments may use another oxide or a nitride for the tier insulating layers 130, 136. A floating gate 120 is separated from the memory cell body 110 by a tunneling dielectric film 122 and a control gate 124 is separated from the floating gate 120 by a blocking dielectric film 126. In the embodiment shown, the floating gate 120 is separated from the tier insulating layers 138, 136 by the blocking dielectric film 126. The floating gate 120 is flanked by the memory cell body 110 and the control gate 124 to form a memory cell. The thickness 140 of the floating gate 120 is at least as thick as the thickness 144 of the control gate 124. In the embodiment shown in FIG. 1A, the thickness 140 of the floating gate 120 is approximately the same as the thickness 144 of the control gate 124. This may be accomplished by having the thickness of the sacrificial layers 132, 134 be approximately the same as the thickness of the blocking dielectric film 126 and leaving the blocking dielectric film 126 in place on the tier insulating layers 130, 136 as the floating gate 120 is formed.

In some embodiments, the control gate 124 is sandwiched by sacrificial layers 132, 134. The sacrificial layers 132, 134 may be made from an insulating material that may be the same material, or may be a different material, than the tier insulating layers 130, 136. Whatever material is used for the sacrificial layers 132, 134, it is differentiated from the material of the tier insulating layers 130, 136, meaning that there is a difference in the materials so that the material of the sacrificial layers 132,134 may be etched at a faster rate than the material of the tier insulating layers 130, 136. The other various parts of the memory cell 100 may be made from a variety of materials, depending on the embodiment, but in some embodiments, the memory cell body 110, the floating gate 120 and the control gate 124 are made, at least in part, of polysilicon, the tunneling dielectric film 122 is made with an oxide, such as silicon oxide, and the blocking dielectric film 126 is an inter-poly dielectric made from a nitride film, or other high dielectric film, sandwiched between two oxide films. In some embodiments, the blocking dielectric film 126 is made with a film of silicon nitride, aluminum oxide, hafnium oxide, or hafnium silicate sandwiched between two films of silicon oxide.

In the embodiment shown in FIGS. 1A and 1B, the floating gate 120 may form an annulus around the memory cell body 110, and that the control gate 124 surrounds the floating gate 120. In other embodiments, the control gate 124 may not fully surround the memory cell body 110 with the floating gate which may allow for two or more separate memory cells to be formed in the same layer around the memory cell body 110. In such cases, or in certain other embodiments, the control gate may not fully surround the floating gate.

With the geometry shown for the memory cell 100, the shortest path from any point in the control gate 124 to the memory cell body 110 passes through the floating gate 120, as shown by the arrow 150. To avoid passing through the floating gate 120, as shown by arrow 152, the path is at an angle, which is not the shortest distance from the control gate 124 to the memory cell body 110. In such a geometry, the control gate 124 and the floating gate 120 are self-aligned, which may reduce tunneling current between the control gate 124 and the channel of the memory cell in the memory cell body 110, eliminate an electron trapping layer along the sidewall of the floating gate 120 in a direct electric field line from the control gate 124 to the memory body 110, and may increase the reliability of the floating gate flash memory cell 100.

Figure 1C:
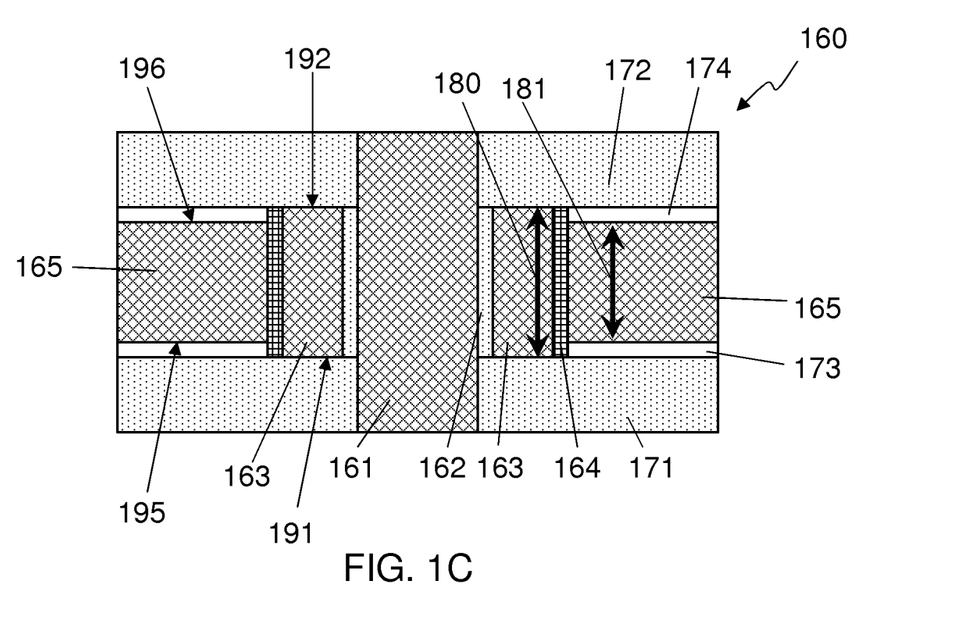
FIG. 1C shows a top cross-sectional views of an alternative embodiment of a memory cell with a self-aligned floating gate.

FIG. 1C shows a top cross-sectional view of an alternative embodiment of a memory cell 160 with a self-aligned floating gate. The memory cell 160 shown in FIG. 1C may be a part of a larger vertical memory structure extending out from a substrate and is similar to the memory cell 100 shown in FIGS. 1A and 1B. The memory cell 160 may be formed around a memory cell body 161 that may be made from a semiconductor material, and the memory cell body 110 may be shared between several memory cells, with an individual memory cell 100 using a portion of the pillar for its channel. The memory cell 160 may be interposed between a first tier insulating layer 171 and a second tier insulating layer 172. A floating gate 163 is separated from the memory cell body 161 by a tunneling dielectric film 162 and a control gate 165 is separated from the floating gate 163 by a blocking dielectric film 164. The floating gate 163 is flanked by the memory cell body 161 and the control gate 165 to form a memory cell. The control gate 165 is sandwiched by sacrificial layers 173, 174.

In the embodiment shown, the blocking dielectric film 164 is not interposed between the floating gate 164 and the tier insulating layers 171, 172. This may be accomplished during fabrication by not forming the blocking dielectric film 164 in those locations, or by removing it after it is formed, depending on the embodiment. The thickness 180 of the floating gate 163 is at least as thick as the thickness 181 of the control gate 165. In the geometry shown, a near surface 195 of the control gate 165 is no closer to the substrate than a near surface 191 of the floating gate 163, and a far surface 149 of the control gate 165 is no farther from the substrate than a far surface 192 of the floating gate 163. In such a geometry the control gate 124 and the floating gate 120 may be thought of as self-aligned, similar to the geometry shown in FIG. 1A.

Figure 2A:
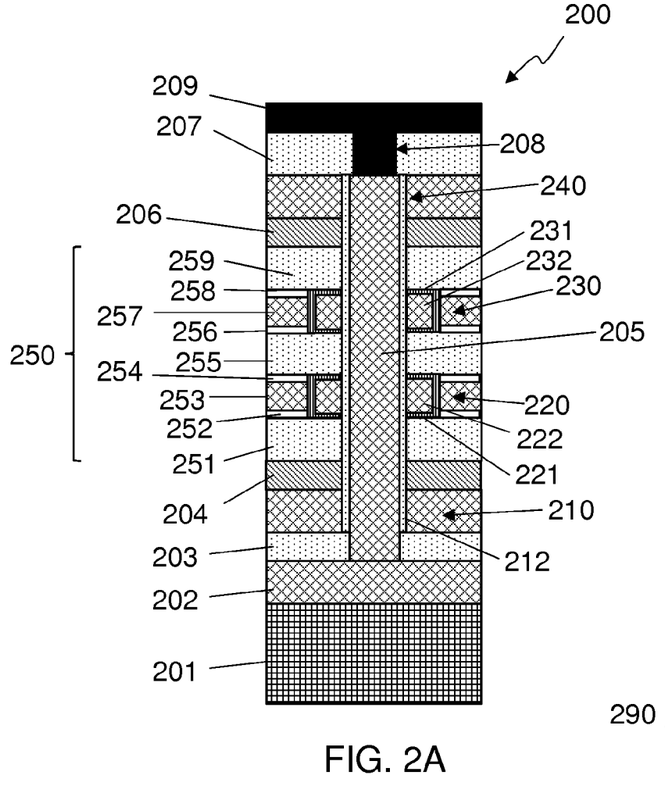
FIG. 2A shows a side cross-section of an embodiment of a vertical NAND flash string with self-aligned floating gates.

FIG. 2A shows a side cross-section of an embodiment of a vertical NAND flash string 200 with self-aligned floating gates. A source line 202 may be formed on top of the base substrate 201. A polysilicon pillar 205 may be in electrical contact with the source line 202 and extend vertically from the source line 202. The polysilicon pillar 205 may be surrounded by a tunneling dielectric film 212. An insulating layer 203 may separate the source line 202 from a source select gate 210, which uses a portion of the polysilicon pillar 205 for its channel. The source select gate 210 may be separated from the memory cells 250 by insulating layer 204. The base substrate 201, the source line 202, the insulating layer 203, the source select gate 210 and the insulating layer 204, may be thought of as the substrate that polysilicon pillar 205, or memory cell body, extends from, and that the NAND string is built around. Other embodiments may have a different composition of the substrate.

The memory cells 250 may include two or more memory cells 220, 230 individually interposed between tier insulating layers 251, 255, 259. The polysilicon pillar 205 is shared by the two or more memory cells 220, 230 and extends through the tier insulating layers 251, 255, 259. The first memory cell 220 may include a body formed from a portion of the polysilicon pillar 205, and an annular shaped floating gate 222, positioned around the polysilicon pillar 205, and separated from the polysilicon pillar 205 by a tunneling dielectric film 212. The first memory cell 220 may also include a control gate 253, which may surround the floating gate 222, and is separated from the floating gate 222 by a blocking dielectric film 221. The floating gate 222 is at least as thick as the control gate 253. The first memory cell 220 may be separated from the second memory cell 230 by the tier insulating layer 255. The second memory cell 230 may include a body formed from another portion of the polysilicon pillar 205, and an annular shaped floating gate 232, positioned around the polysilicon pillar 205, and separated from the polysilicon pillar 205 by a tunneling dielectric film 212. The second memory cell 230 may also include a control gate 257, which may surround the floating gate 232 and is separated from the floating gate 232 by the blocking dielectric film 231. The floating gate 232 is at least as thick as the control gate 257.

In the embodiment shown in FIG. 2A, sacrificial layers 252, 254 sandwich the control gate 253, with the sacrificial layer 252 situated between the control gate 253 and the tier insulating layer 251, and the sacrificial layer 254 situated between the control gate 253 and the tier insulating layer 255. Sacrificial layers 256, 258 sandwich the control gate 257, with the sacrificial layer 256 situated between the control gate 257 and the tier insulating layer 255, and the sacrificial layer 258 situated between the control gate 257 and the tier insulating layer 259. The sacrificial layers 252, 254, 256, 258 are differentiated from the tier insulating layers 251, 255, 259 to allow selective etching of the sacrificial layers 252, 254, 256, 258 without significantly impacting the tier insulating layers 251, 255, 259.

The floating gates 222, 232 are separated from the tier insulating layers 251, 255, 259 by blocking dielectric films 221, 231. The blocking dielectric films 221, 231 wrap around the floating gates 222, 232 to cover the top, bottom, and outside of the annulus. The sacrificial layers 252, 254, 256, 258 are individually no thinner than the blocking dielectric films 221, 231 which keeps the floating gates 222, 232 at least as thick as the control gates 253, 257. By keeping the sacrificial layers at least as thick as the blocking dielectric films 221, 231, the shortest path from anywhere in a control gate 253, 257 to the polysilicon pillar 205, passes through a floating gate 222, 232.

A drain select gate 240 may be separated from the memory cells 250 by an insulating layer 206 and may couple the body of the NAND string, polysilicon pillar 205, to a bit line 209 through a via 208. The bit line 209 may be separated from the drain select gate 240 by an insulating layer 207.

Figure 2B:
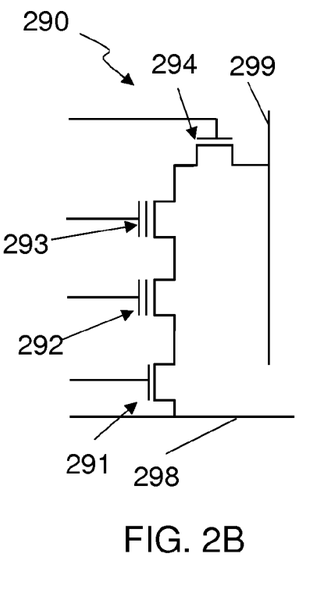
FIG. 2B shows a schematic of the NAND flash string of FIG. 2A.

FIG. 2B shows a schematic 290 of the NAND flash string 200 of FIG. 2A. The NAND string 200 includes two floating gate field effect transistors (FG-FET) 292, 293 coupled together serially. FG-FET 292 corresponds to the memory cell 220 and FG-FET 293 corresponds to the memory cell 230. The FG-FET 292 is coupled to field-effect transistor (FET) 291, which corresponds to the source select gate 210, with the conductor 298 corresponding to the source line 202.

FG-FET 293 is coupled to FET 294 which corresponds to the drain select gate 240 and conductor 299 corresponds to bit line 209.

Figure 3:
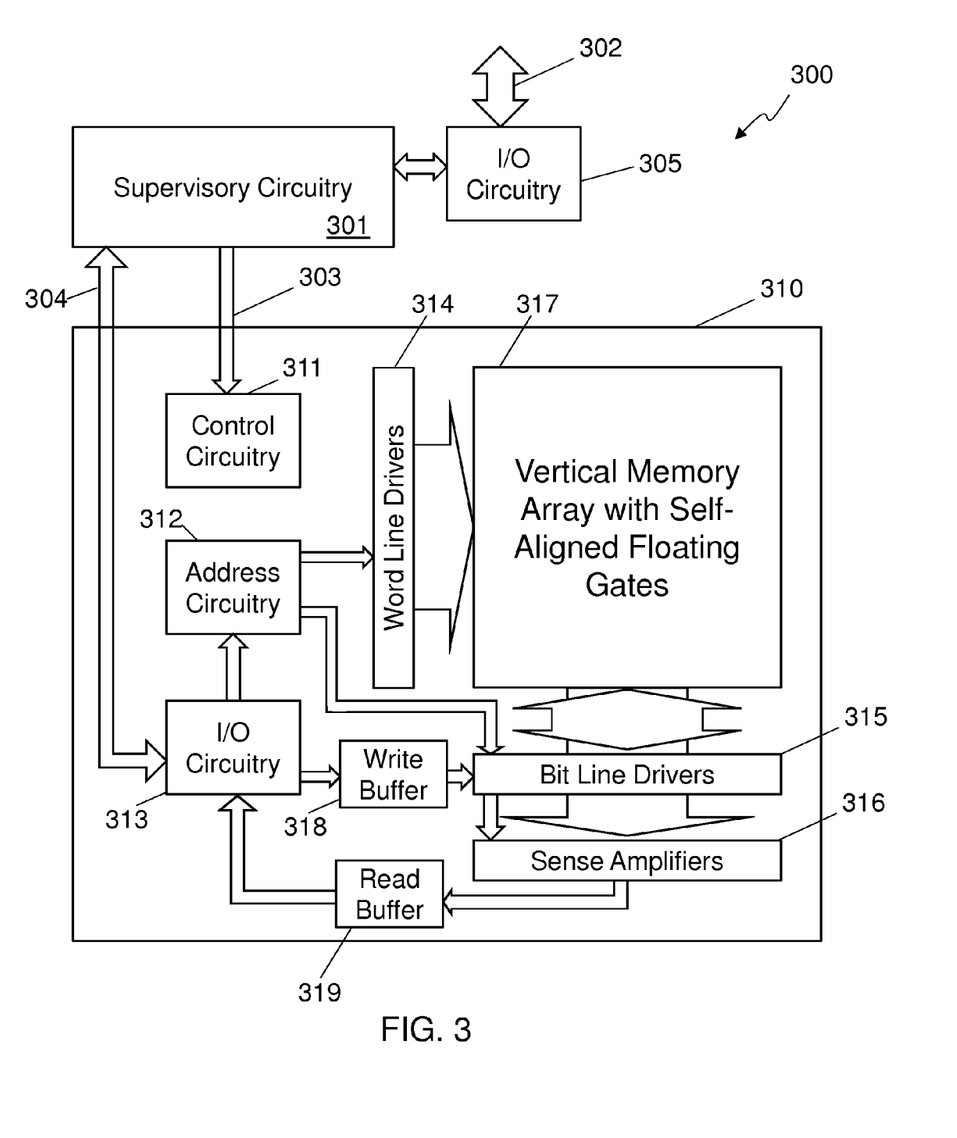
FIG. 3 is a block diagram of an embodiment of an electronic system using three dimensional flash memory with self-aligned floating gates.

FIG. 3 is a block diagram of an embodiment of an electronic system 300 with memory 310 using three dimensional NAND flash memory with self-aligned floating gates. Supervisory circuitry 301 is coupled to the memory device 310 with control/address lines 303 and data lines 304. In some embodiments, data and control may utilize the same lines. The supervisory circuitry 301 may include a processor, microprocessor, microcontroller, finite state machine, or some other type of controlling circuitry. The supervisory circuitry 301 may execute instructions of a program in some embodiments. In some embodiments, the supervisory circuitry 301 may be integrated in the same package or even on the same die as the memory device 310. In some embodiments, the supervisory circuitry 301 may be integrated with the control circuitry 311, allowing some of the same circuitry to be used for both functions. The supervisory circuitry 301 may have external memory, such as random access memory (RAM) and read only memory (ROM), used for program storage and intermediate data or it may have internal RAM or ROM. In some embodiments, the supervisory circuitry 301 may use the memory device 310 for program or data storage. A program running on the supervisory circuitry 301 may implement many different functions including, but not limited to, an operating system, a file system, memory block remapping, and error management.

In some embodiments an external connection 302 is provided. The external connection 302 is coupled to input/output (I/O) circuitry 305 which may then be coupled to the supervisory circuitry 301 and allows the supervisory circuitry 301 to communicate to external devices. In some embodiments, the I/O circuitry 305 may be integrated with the supervisory circuitry 301 so that the external connection 302 is directly coupled to the supervisory circuitry 301. If the electronic system 300 is a storage system, the external connection 302 may be used to provide an external device with non-volatile storage. The electronic system 300 may be a solid-state drive (SSD), a USB thumb drive, a secure digital card (SD Card), or any other type of storage system. The external connection 302 may be used to connect to a computer or other intelligent device such as a cell phone or digital camera using a standard or proprietary communication protocol. Examples of computer communication protocols that the external connection 302 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 300 is a computing system, such as a mobile telephone, a tablet, a notebook computer, a set-top box, or some other type of computing system, the external connection 302 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 310 may include an array 317 of memory cells. The memory cells may be organized into three dimensional stacks of memory cells, such as vertical NAND strings. The vertical NAND strings may include self-aligned floating gates as discussed above. Address lines and control lines 303 may be received and decoded by control circuitry 311, I/O circuitry 313 and address circuitry 312 which may provide control to the memory array 317 through the word line drivers 314 and bit line drivers 315. I/O circuitry 313 may couple to the data lines 304 allowing data to be received from and sent to the processor 301. Data read from the memory array 317 may be determined by the sense amplifiers 316 and temporarily stored in read buffers 319. Data to be written to the memory array 317 may be temporarily stored in write buffers 318 before being transferred to the memory array 317.

The system illustrated in FIG. 3 has been simplified to facilitate a basic understanding of the features of the system. Many different embodiments are possible including using a single supervisory circuitry 301 to control several memory devices 310 to provide for more storage space. Additional functions, such as a video graphics controller driving a display, and other devices for human oriented I/O may be included in some embodiments.

Figure 4:
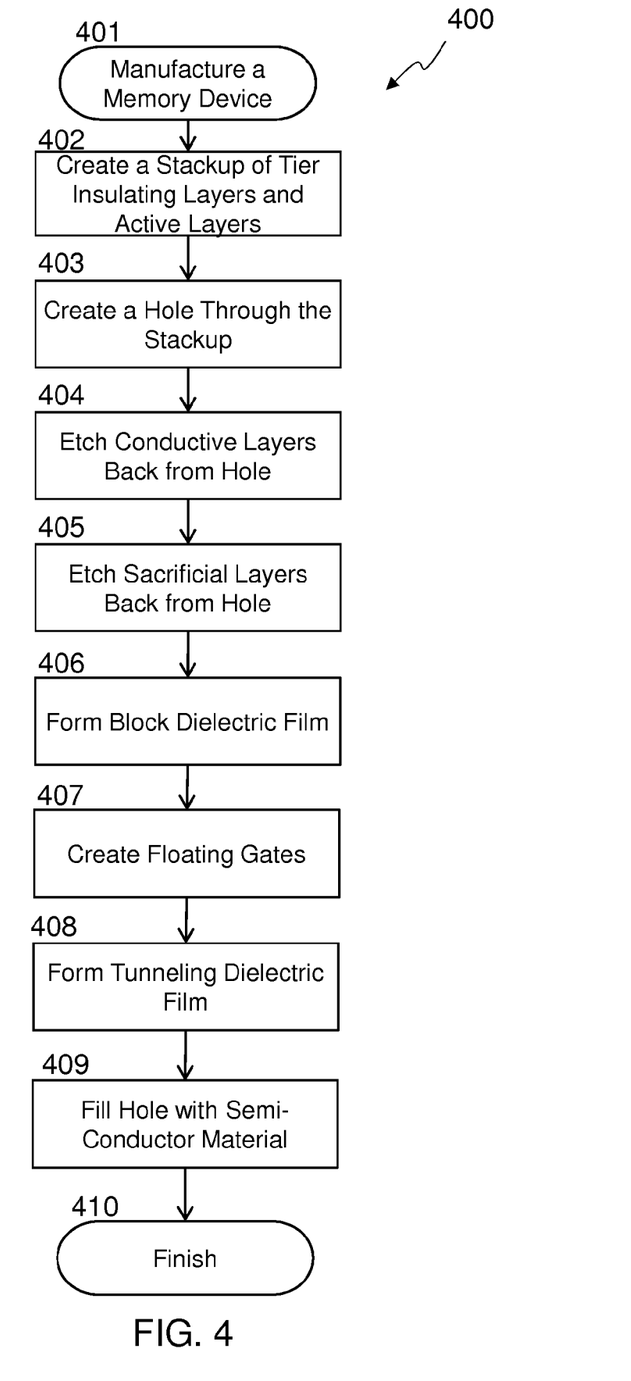
FIG. 4 is a flowchart of an embodiment of a method to fabricate a three dimensional memory structure with self-aligned floating gates.

FIG. 4 is a flowchart 400 of an embodiment of a method to fabricate a three dimensional memory structure with self-aligned floating gates, and FIG. 5A-L show cross-sectional side views of various stages of the method shown in FIG. 4. FIG. 4 and FIG. 5A-L are discussed together below.

Flowchart 400 may begin to form a 3D memory structure at block 401 and may create a stackup 500 of at least two alternating tier insulating layers and circuit layers above a substrate at block 402, where the word stackup refers to the layers that may be used to create memory cells. The substrate may include a base wafer or other structure upon which various materials be deposited, grown, or otherwise put in place in various patterns, layers, and thicknesses with a variety of processes to create circuitry for the memory. The substrate may include some number of layers of other materials on the wafer before the stackup is created. In the embodiment shown in FIG. 5A, a first tier insulating layer 501, second tier insulating layer 505 and third tier insulating layer 509 have circuit layers interposed between them with the first circuit layer including conductive layer 503 sandwiched between sacrificial layers 502, 504 and the second circuit layer including conductive layer 507 sandwiched between sacrificial layers 506, 508. Some embodiments may include additional layers, films, or other material, between the various layers of the stackup described here. Creating a layer may be performed by any process, including, but not limited to, deposition of a material, implantation or doping of an existing material, or inducing a chemical reaction at the surface of an existing material. Patterning and/or etching processes may be performed at various stages during the formation of the stackup 500, such as to create individual traces in the conductive layers 503, 507. The materials used may vary between embodiments, but in at least one embodiment, the conductive layers 503, 507 may be formed using polysilicon, which may be doped to improve conductivity in some embodiments, and the tier insulating layers 501, 505, 509 and sacrificial layers 502, 504, 506, 508 may formed using an oxide or nitride, such as silicon oxide or silicon nitride, although other materials may be used in other embodiments.

Figure 5A:
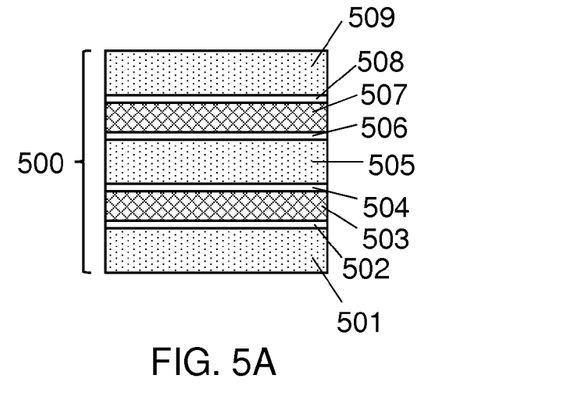

While the tier insulating layers 501, 505, 509 and sacrificial layers 502, 504, 506, 508 may be made with different materials in some embodiments, other embodiments may use the same material for the tier insulating layers 501, 505, 509 and sacrificial layers 502, 504, 506, 508. In either case, the tier insulating layers 501, 505, 509 and sacrificial layers 502, 504, 506, 508 are differentiated to allow selective etching of the sacrificial layers 502, 504, 506, 508 without etching the tier insulating layers 501, 505, 509. In some embodiments, the sacrificial layers 502, 504, 506, 508 may be modified during deposition, using techniques such as, but not limited to, changing the deposition precursor, the film power, the pressure, or the doping, to differentiate the sacrificial layers 502, 504, 506, 508 from the tier insulating layers 501, 505, 509. In other embodiments, the sacrificial layers 502, 504, 506, 508 may be modified after deposition, using techniques such as, but not limited to, plasma processing, thermal annealing, doping, or implantation, to differentiate the sacrificial layers 502, 504, 506, 508 from the tier insulating layers 501, 505, 509. Any technique and/or material may be used to increase the etch rate of the sacrificial layers 502, 504, 506, 508 relative to the tier insulating layers 501, 505, 509.

Figure 5B:
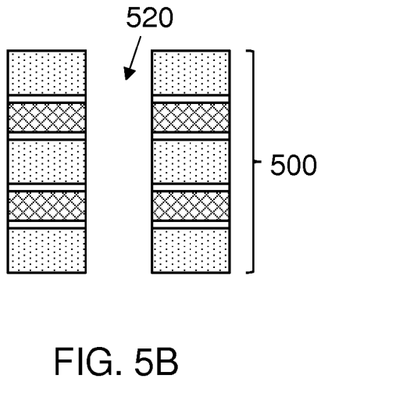
Figure 5C:
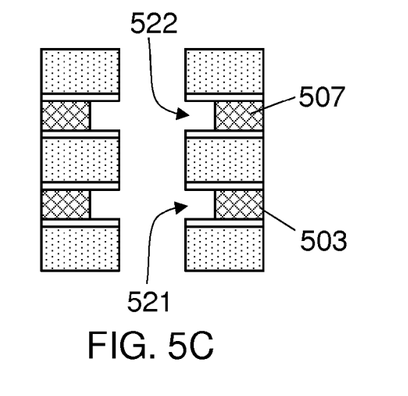
Figure 5D:
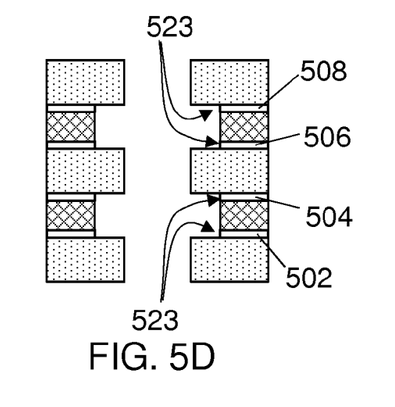

At block 403, a hole 520 may be created through the stackup 500, as shown in FIG. 5B. The hole 520 may be created using any process, including, but not limited to chemical and/or mechanical processes. The hole 520 may be roughly circular in many embodiments, although some embodiments may use other shapes. The conductive layers 503, 507 may be etched back from the hole 520 at block 404 to create cavities 521, 522 extending away from the hole 520 as shown in FIG. 5C. The cavities 521, 522 may be roughly annular in shape in some embodiments. The sacrificial layers 502, 504, 506, 508 may be etched back from the hole 520 at block 405 as shown in FIG. 5D. In some embodiments the edges 523 of the sacrificial layers 502, 504, 506, 508 are etched back to about the same distance from the hole 510 as the conductive layers 503, 507, although various embodiments may target more or less etching of the sacrificial layers 502, 504, 506, 508 than the conductive layers 503, 507. The etching processes used in blocks 404 and 405 may be selective to individually etch the conductive layers 503, 507 and sacrificial layers 502, 504, 506, 508 individually, but some embodiments may combine the etching of the conductive layers 503, 507 and sacrificial layers 502, 504, 506, 508, to form cavities 521, 522. The etching done in blocks 404 and 405 may not etch significant amounts of the the tier insulating layers 501, 505, 509.

Figure 5E:
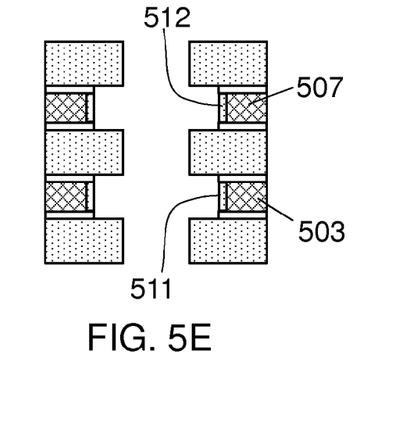
Figure 5F:
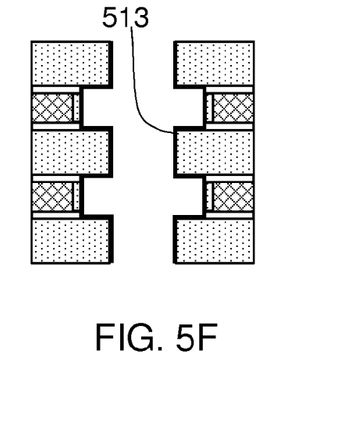
Figure 5G:
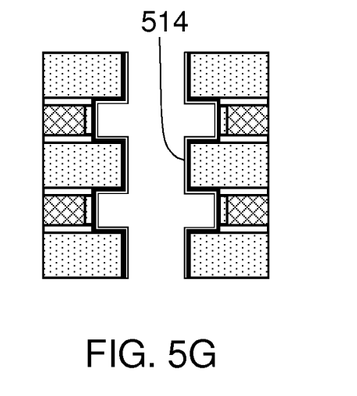

At block 406, the blocking dielectric film may be formed. The blocking dielectric film may be as thick as, or may be thinner than, the sacrificial layers 502, 504, 506, 508 on the tier insulating layers 501, 505, 509 inside the cavities 521, 522. Alternatively, in some embodiments, techniques may be used so that no blocking dielectric film is deposited on the surfaces of the tier insulating layers 501, 505, 509 inside the cavities 521, 522. In yet other embodiments techniques may be employed to remove the blocking dielectric film from the surfaces of the tier insulating layers 501, 505, 509 inside the cavities 521, 522. Depending on the embodiment, the blocking dielectric film may be formed in several steps and may include depositing a blocking dielectric film inside the hole 520, including the cavities 521, 522. In other embodiments, such as shown in FIG. 5E-5G, the blocking dielectric film may include multiple layers that are formed individually. In at least one embodiment, an outer oxide film 511, 512 is created on an exposed area of the conductive layers 503, 507 after the etching of the conductive layers 503, 507 as shown in FIG. 5E. The outer oxide film 511, 512 may be grown, deposited, or otherwise formed by various well-known processes, according to the embodiment. FIG. 5F shows a high dielectric film 513 deposited in the hole 520, including the cavities 521, 522 and FIG. 5G shows an inner oxide film 514 deposited on top of the high dielectric film 513. The high dielectric film 513 has a higher dielectric constant than the outer oxide film 511, 512 and the inner oxide film 514. The outer oxide film 511, 512 and the inner oxide film 514 may be made from silicon oxide in some embodiments, and the high dielectric film 513 may be made from materials such as, but not limited to, silicon nitride, aluminum oxide, hafnium oxide, or hafnium silicate.

Figure 5H:
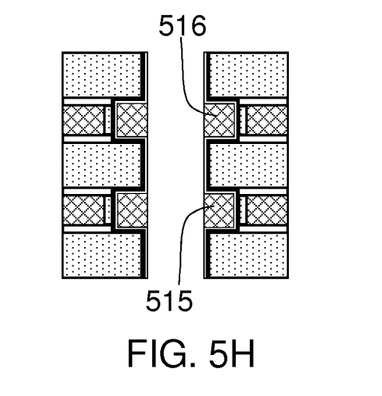

At block 407, material, which may be polysilicon in some embodiments, may be deposited, grown, or otherwise placed to create the floating gates 515, 516 in the cavities 521, 522 created by the etching of the conductive layers 503, 507 and the sacrificial layers 502, 504, 506, 508 as shown in FIG. 5H. The floating gates 515, 516 are separated from the conductive layers 503, 507 and the tier insulating layers 501, 505, 509 by the blocking dielectric film, which may include the high dielectric film 513 and the inner oxide film 514. Together, the high dielectric film 513 sandwiched between the outer oxide film 511, 512 and the inner oxide film 514 may form an oxide-nitride-oxide (ONO) inter-poly dielectric (IPD) that may separate control gates formed in the conductive layers 503, 507 from the floating gates 515, 516 of floating gate memory cells.

Figure 5J:
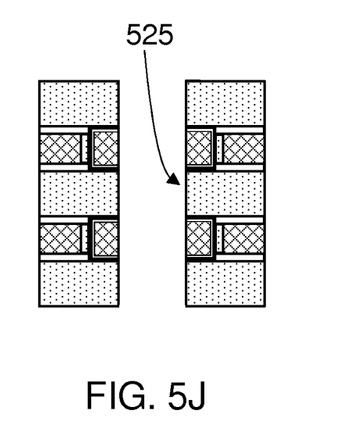
Figure 5K:
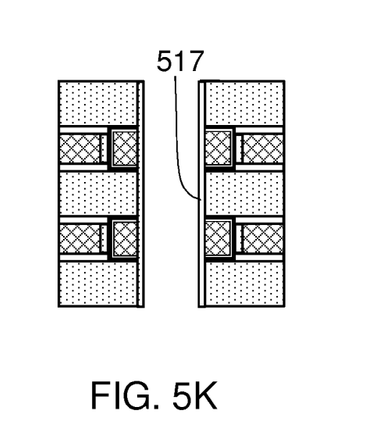
Figure 5L:
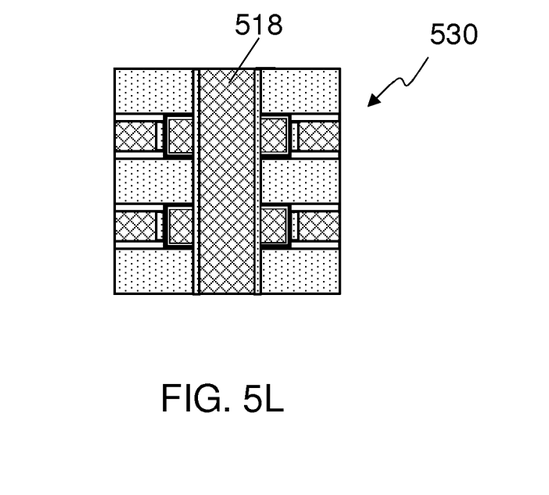

In some embodiments, the blocking dielectric film 513, 514 may be removed from the inside of the hole 525, along with some of the floating gate material 515, 516 as shown in FIG. 5J (5I is not used to identify a figure to avoid confusion), to provide a smoother, more regular surface before forming, in block 408, a tunneling dielectric film 517 by depositing, growing, or otherwise creating the tunneling dielectric film 517 inside the hole as shown in FIG. 5K. The tunneling dielectric film 517 may be an oxide in some embodiments, although other embodiments may use a different material. At block 409, the hole 525 may be filled with semiconductor material 518, which may include polysilicon in some embodiments. Note that the use of the word 'filled' both here and in the claims is not meant to imply that the hole 525 is completely filled with the semiconductor material 518, as some embodiments may include other material and/or may leave space at the top of the hole 525 that is unfilled. Note that the semiconductor material 518 is separated from the floating gates 515, 516 by the tunneling dielectric film 517. The flowchart 400 may then finish at block 410 and the rest of the memory may be manufactured with additional processes.

By using the method described in FIGS. 4 and 5A-5L, the control gates of the memory cells are no thicker than the floating gates and are self-aligned so that a near surface of the control gate is no closer to the substrate than a near surface of the floating gate, and a far surface of the control gate is no farther from the substrate than a far surface of the floating gate. A self-aligned floating gate may be defined as a floating gate in a structure where a shortest path from any point in an associated control gate, to the semiconductor material that the fills the hole, passes through the floating gate. Such a self-aligned geometry may reduce tunneling current between the control gate and the channel of the memory cell and may increase the reliability of the floating gate flash memory cell.

Other methods may also be used to form the memory cell with a self-aligned floating gate. In an alternate embodiment of a method to manufacture a memory, the stackup may be formed without sacrificial layers, a hole created and the conductive layers etched back from the hole to form annular cavities. An outer oxide film may be grown on the exposed areas of the conductive layers and a nitride film deposited inside of the hole and cavities. Another material that is differentiated from the nitride film may then be deposited in the cavity, such as polysilicon. The nitride film may then be etched back between the tier insulating layer and the polysilicon so that only the nitride film covering the outer oxide film is left. The polysilicon may then be etched away to expose the nitride film and an inner oxide film that is differentiated from the tier insulating layer may then be deposited on the inside of the hole and cavity. The cavity may then be re-filled with material, such as polysilicon, and then the inner oxide film etched away until only the film in contact with the nitride layer is left, creating the oxide-nitride-oxide (ONO) inter-poly dielectric (IPD) layer to separate the control gate from the floating gate of the memory cell. The gap between the polysilicon and the tier insulating layer may then be filled with polysilicon to complete the floating gate, or the existing polysilicon may be etched away and the cavity re-filled with material for the floating gate. A tunneling dielectric film may then be deposited inside the hole and the hole filled with semi-conducting material.

The flowchart and/or block diagrams in the figures help to illustrate the architecture, functionality, and operation of possible implementations of systems, and methods of various embodiments. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example memory device may include a memory cell body extending from a substrate, a self-aligned floating gate separated from the memory cell body by a tunneling dielectric film, and a control gate separated from the floating gate by a blocking dielectric film. In the example memory the self-aligned floating gate is flanked by the memory cell body and the control gate to form a memory cell, and the self-aligned floating gate is at least as thick as the control gate. Some example memory devices may include sacrificial layers sandwiching the control gate. In some example memory devices a near surface of the control gate is no closer to the substrate than a near surface of the self-aligned floating gate, and a far surface of the control gate is no farther from the substrate than a far surface of the self-aligned floating gate. In some example memory devices the memory cell body, the self-aligned floating gate and the control gate may be made from polysilicon, the tunneling dielectric film may be made from of an oxide, and the blocking dielectric film is an inter-poly dielectric comprising a nitride film sandwiched between two oxide films. In some example memory devices the memory cell body includes a pillar with a substantially circular cross-section, the self-aligned floating gate includes an annulus around the memory cell body, and the control gate surrounds the self-aligned floating gate. In some example memory devices the self-aligned floating gate is a first floating gate, the control gate is a first control gate, and the memory cell is a first memory cell. The example memory device may also include a second floating gate separated from the memory cell body by the tunneling dielectric film, a second control gate separated from the second floating gate by the blocking dielectric film, and a tier insulating layer. In some example memory devices the first floating gate and the first control gate are positioned between the substrate and the tier insulating layer, the second floating gate and the second control gate are positioned on an opposite side of the tier insulating layer from the first floating gate and the first control gate, and the memory cell body extends through the tier insulating layer. In some example memory devices the second floating gate is flanked by the memory cell body and the second control gate to form a second memory cell, and the second floating gate is at least as thick as the second control gate. Some example memory devices may also include a first sacrificial layer situated between the first control gate and the tier insulating layer, and a second sacrificial layer situated between the tier insulating layer and the second control gate. In some example memory devices, the first and second sacrificial layers are differentiated from the tier insulating layer. In some example memory devices the first and second floating gates are separated from the tier insulating layer by the blocking dielectric film, and the first and second sacrificial layers are individually no thinner than the blocking dielectric film. Any combination of the examples of this paragraph may be used in embodiments.

An example electronic system may include supervisory circuitry, and at least one memory device coupled to the supervisory circuitry. The memory device in the example electronic system may be any of the example memory devices described in the previous paragraph. The memory device in the example electronic system may include two or more memory cells individually interposed between tier insulating layers. A memory cell of the two or more memory cells may include a body formed in a portion of a polysilicon pillar, an annular shaped floating gate positioned around the polysilicon pillar, and separated from the polysilicon pillar by a tunneling dielectric film, and a control gate that surrounds the floating gate and is separated from the floating gate by a blocking dielectric film. In the memory cell in some example electronic systems the floating gate is at least as thick as the control gate, and the polysilicon pillar is shared by the two or more memory cells and extends through the tier insulating layers. Some example electronic systems may also include I/O circuitry coupled to the supervisory circuitry. Some example electronic systems may be a solid-state drive. In a memory cell of some example electronic systems a shortest path from any point in the control gate to the polysilicon passes through the floating gate. A memory cell of some example electronic systems may also include sacrificial layers situated between the control gate and the tier insulating layers. In a memory cell of some example electronic systems the sacrificial layers are differentiated from the tier insulating layers. In a memory cell of some example electronic systems the floating gate is separated from the tier insulating layers by the blocking dielectric film, and the sacrificial layers are individually no thinner than the blocking dielectric film. In a memory cell of some example electronic systems the floating gate and the control gate are formed from polysilicon, the tunneling dielectric film is made with an oxide, and the blocking dielectric film is an inter-poly dielectric including a nitride film sandwiched between two oxide films. Any combination of the examples of this paragraph may be used in embodiments.

An example method of manufacturing a memory device may include creating a stackup of at least two alternating tier insulating layers and circuit layers individually including a conductive layer sandwiched between sacrificial layers that are differentiated from the tier insulating layer, creating a hole through the stackup, etching the conductive layers back from the hole, etching the sacrificial layers back from the hole, forming a blocking dielectric film no thicker than an individual sacrificial layer of the sacrificial layers inside the hole, creating floating gates in the cavities created by the etching of the conductive layers and the sacrificial layers so that the floating gates are separated from the conductive layers and the tier insulating layers by the blocking dielectric film, forming a tunneling dielectric film inside the hole, and filling the hole with semiconductor material, so that the semiconductor material is separated from the floating gates by the tunneling dielectric film. In some example methods of manufacturing a memory device the conductive layers, the floating gates and the semiconductor material are made from polysilicon, and the tier insulating layers and the sacrificial layers are made from an oxide or a nitride. Some example methods of manufacturing a memory device may also include creating an outer oxide film on an exposed area of the conductive layers after the etching of the conductive layers so that the blocking dielectric film includes a high dielectric film and an inner oxide film, the high dielectric film having a higher dielectric constant than the inner and outer oxide films, and the conductive layers are separated from the floating gates by an inter-poly dielectric comprising the high dielectric film sandwiched between the outer oxide film and the inner oxide film. In some example methods of manufacturing a memory device the inner and outer oxide film are made from silicon oxide, and the high dielectric film is made from silicon nitride, aluminum oxide, hafnium oxide, or hafnium silicate. In some example methods of manufacturing a memory device creating the stackup includes modifying the sacrificial layers during deposition to differentiate the sacrificial layers from the tier insulating layers. In some example methods of manufacturing a memory device the creating the stackup may include treating the sacrificial layers after deposition to differentiate the sacrificial layers from the tier insulating layers. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A memory device comprising:
   a memory cell body that includes a pillar with a substantially circular cross-section;
   a floating gate separated from the memory cell body by a tunneling dielectric film, the floating gate includes an annulus around the memory cell body; and a control gate separated from the floating gate by a blocking dielectric film, the control gate is aligned with and surrounds the floating gate, and the floating gate is at least as thick as the control gate, wherein the floating gate and the control gate are positioned between a substrate and a tier insulating layer and the pillar with the substantially circular cross-section extends through the tier insulating layer.

2. The memory device of claim 1, further comprising sacrificial layers sandwiching the control gate.

3. The memory device of claim 1, wherein a near surface of the control gate is no closer to the substrate than a near surface of the floating gate; and a far surface of the control gate is no farther from the substrate than a far surface of the floating gate.

4. The memory device of claim 1, wherein the memory cell body, the floating gate and the control gate comprise polysilicon;

the tunneling dielectric film is comprised of an oxide; and the blocking dielectric film is an inter-poly dielectric comprising a nitride film sandwiched between two oxide films.

5. The memory device of claim 1, wherein the floating gate is a first floating gate, the control gate is a first control gate, and the memory cell body is for a first memory cell, the memory device further comprising:

a second floating gate separated from the memory cell body by the tunneling dielectric film;

a second control gate separated from the second floating gate by the blocking dielectric film; and the tier insulating layer;

wherein the second floating gate and the second control gate are positioned on an opposite side of the tier insulating layer from the first floating gate and the first control gate; and wherein the second floating gate is flanked by the memory cell body and the second control gate to form a second memory cell, and the second floating gate is at least as thick as the second control gate.

6. The memory device of claim 5, further comprising:

a first sacrificial layer situated between the first control gate and the tier insulating layer; and a second sacrificial layer situated between the tier insulating layer and the second control gate;

wherein the first and second sacrificial layers are differentiated from the tier insulating layer.

7. The memory device of claim 6, wherein the first and second floating gates are separated from the tier insulating layer by the blocking dielectric film; and the first and second sacrificial layers are individually no thinner than the blocking dielectric film.

8. An electronic system comprising:

supervisory circuitry; and at least one memory device coupled to the supervisory circuitry, the at least one memory device including:

a memory cell body that includes a pillar with a substantially circular cross-section;

a floating gate separated from the memory cell body by a tunneling dielectric film, the floating gate includes an annulus around the memory cell body; and a control gate separated from the floating gate by a blocking dielectric film, the control gate is aligned with and surrounds the floating gate, and the floating gate is at least as thick as the control gate, wherein the floating gate and the control gate are positioned between a substrate and a tier insulating layer and the pillar with the substantially circular cross-section extends through the tier insulating layer.

9. The electronic system of claim 8, further comprising I/O circuitry coupled to the supervisory circuitry.

10. The electronic system of claim 8, wherein the electronic system comprises a solid-state drive.

11. The electronic system of claim 8, further comprising sacrificial layers sandwiching the control gate.

12. The electronic system of claim 8, comprising:

a near surface of the control gate is no closer to the substrate than a near surface of the floating gate; and a far surface of the control gate is no farther from the substrate than a far surface of the floating gate.

13. The electronic system of claim 8, comprising:

the memory cell body, the floating gate and the control gate comprise polysilicon;

the tunneling dielectric film is comprised of an oxide; and the blocking dielectric film is an inter-poly dielectric comprising a nitride film sandwiched between two oxide films.

14. The electronic system of claim 8, wherein the floating gate is a first floating gate, the control gate is a first control gate, and the memory cell body is for a first memory cell, the at least one memory device further comprising:

a second floating gate separated from the memory cell body by the tunneling dielectric film;

a second control gate separated from the second floating gate by the blocking dielectric film; and the tier insulating layer;

wherein the second floating gate and the second control gate are positioned on an opposite side of the tier insulating layer from the first floating gate and the first control gate; and wherein the second floating gate is flanked by the memory cell body and the second control gate to form a second memory cell, and the second floating gate is at least as thick as the second control gate.

15. The electronic system of claim 14, further comprising:

a first sacrificial layer situated between the first control gate and the tier insulating layer; and a second sacrificial layer situated between the tier insulating layer and the second control gate;

wherein the first and second sacrificial layers are differentiated from the tier insulating layer.

16. The electronic system of claim 15, comprising:

the first and second floating gates are separated from the tier insulating layer by the blocking dielectric film; and the first and second sacrificial layers are individually no thinner than the blocking dielectric film.

\* \* \* \* \*